US008648371B2

United States Patent
Kuo

(10) Patent No.: US 8,648,371 B2
(45) Date of Patent: Feb. 11, 2014

(54) LED UNIT HAVING ELECTROCHROMIC ELEMENT

(75) Inventor: Te-Wen Kuo, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/181,459

(22) Filed: Jul. 12, 2011

(65) Prior Publication Data

US 2012/0098007 A1   Apr. 26, 2012

(30) Foreign Application Priority Data

Oct. 22, 2010  (CN) .......................... 2010 1 0515038

(51) Int. Cl.
*H01L 33/00* (2010.01)

(52) U.S. Cl.
USPC   257/98; 257/99; 257/E33.059; 257/E33.072; 362/465; 362/516; 362/800

(58) Field of Classification Search
USPC ............ 257/79, 88, 89, 98, 99, 100, E33.059, 257/E33.058, E33.67, E33.072; 362/84, 362/449, 460, 464, 507, 516, 800
See application file for complete search history.

(56) References Cited

U.S. PATENT DOCUMENTS

| 6,277,523 | B1 | 8/2001 | Giron | |
|---|---|---|---|---|
| 6,441,943 | B1 * | 8/2002 | Roberts et al. | 359/267 |
| 2003/0002179 | A1 * | 1/2003 | Roberts et al. | 359/838 |
| 2008/0224162 | A1 * | 9/2008 | Min et al. | 257/98 |
| 2009/0140630 | A1 * | 6/2009 | Kijima et al. | 313/498 |
| 2010/0082081 | A1 | 4/2010 | Niessen et al. | |
| 2010/0277887 | A1 * | 11/2010 | Su et al. | 362/19 |

FOREIGN PATENT DOCUMENTS

TW             200843808 A    11/2008

* cited by examiner

*Primary Examiner* — William D Coleman
*Assistant Examiner* — Su Kim
(74) *Attorney, Agent, or Firm* — Altis Law Group, Inc.

(57) ABSTRACT

An LED unit includes an LED and an electrochromic element mounted on the LED. The LED includes a base, a light emitting die mounted on the base, a pair of leads electrically connected to the die and an encapsulant sealing the die. The encapsulant has a first area and a second area around the first area. The first area contains yellow phosphor therein, and the second area contains red phosphor therein. The electrochromic element has an opening through which the first area of the encapsulant is exposed. The second area of the encapsulant is covered by the electrochromic element. The electrochromic element can change its color when being electrified, thereby changing the color temperature of the light output from the LED unit.

12 Claims, 4 Drawing Sheets

LED UNIT HAVING ELECTROCHROMIC ELEMENT

BACKGROUND

1. Technical Field

The present disclosure relates to an LED (light emitting diode) unit, and more particularly, to an LED unit having an electrochromic element.

2. Description of Related Art

As new type light source, LEDs are widely used in various applications. A conventional LED includes a base, a pair of leads fixed in the base, a die mounted on the base and electrically connected to the leads and an encapsulant secured to the base and sealing the die. In some particular applications, the LED may be required to change color of the light emitted therefrom according to different situations. A conventional method for changing the color of the LED is to provide a rotatable disk above the LED. The rotatable disk has a plurality of areas containing different colored phosphors therein. The rotatable disk can be rotated to align one of the areas thereof with the LED each time, whereby the light emitted from the LED can be converted by a corresponding phosphor to have a predetermined color.

However, in order to realize rotation of the rotatable disk, a driving device should be mounted with the rotatable disk to support and drive the rotatable disk. The structure of the driving device is complicated and has a lower stability in operation. Furthermore, the driving device is costly, thereby increasing the total cost of the LED.

What is needed, therefore, is an LED unit having an electrochromic element which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
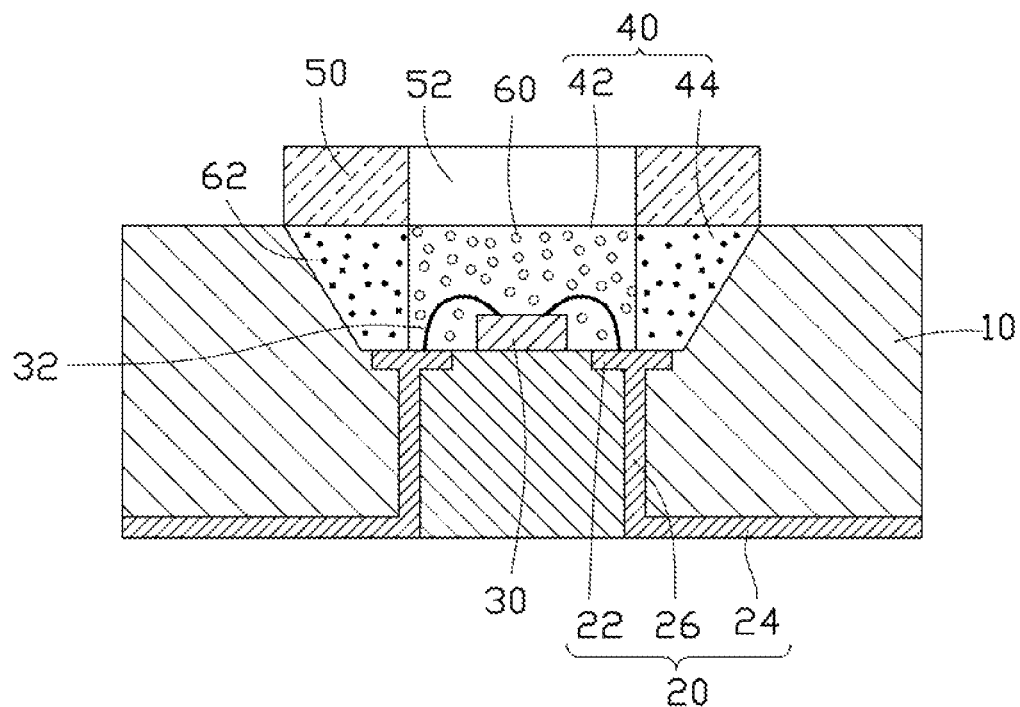
FIG. 1 is a cross-section view of an LED unit in accordance with an embodiment of the present disclosure, wherein an electrochromic element of the LED unit is in a transparent state.
Figure 2:
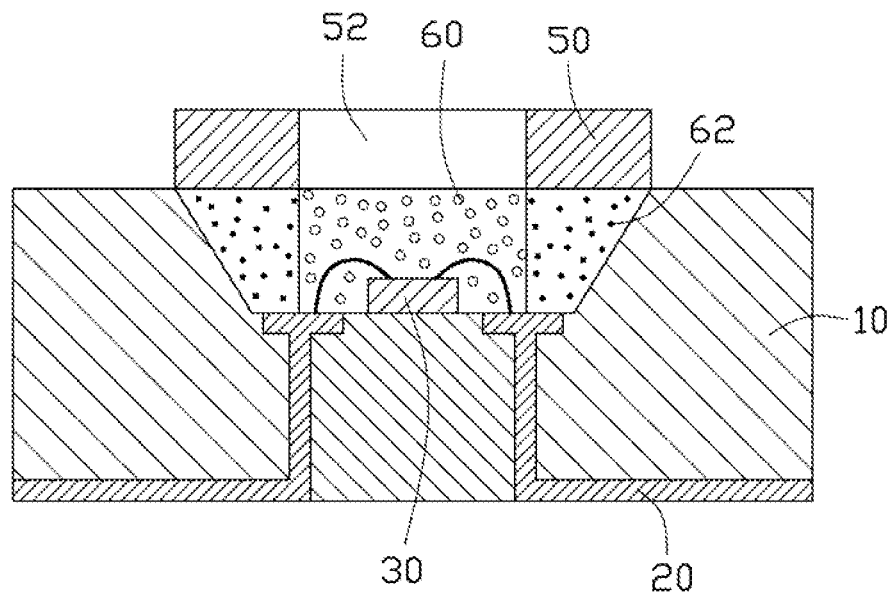
FIG. 2 is similar to FIG. 1, wherein the electrochromic element is in an opaque state.
Figure 3:
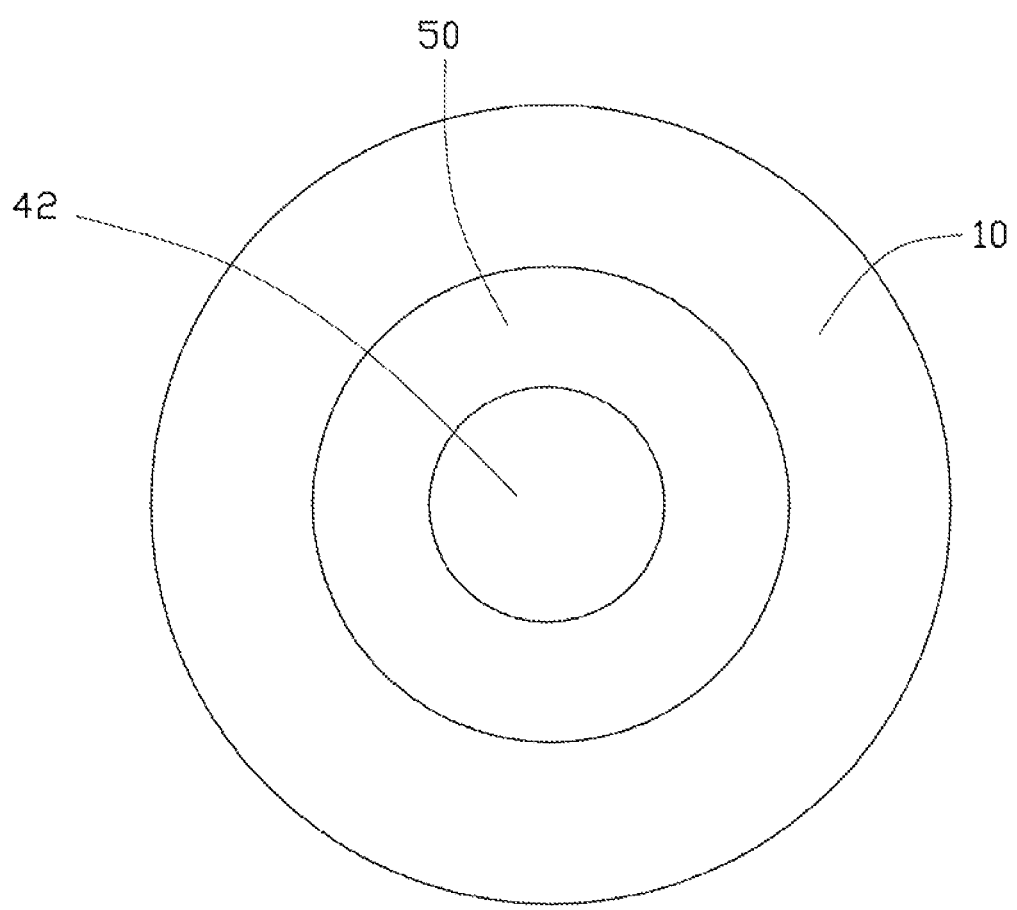
FIG. 3 is top view of the LED unit of FIG. 1.

Referring to FIG. 1, an LED (light emitting diode) unit in accordance with an embodiment of the present disclosure is shown. The LED unit includes an LED (not labeled) and an electrochromic element 50 mounted on the LED.

The LED includes a base 10, a pair of leads 20 embedded within the base 10, a light emitting die 30 fixed on the base 10 and an encapsulant 40 attached to the base 10 and sealing the light emitting die 30. The base 10 may be made of an electrically-insulating and heat-conductive material such as ceramic. A cavity (not labeled) is defined in a top face of the base 10 to receive the light emitting die 30. The cavity has a shape of an inverted truncated cone with an inner diameter thereof gradually increasing upwardly. The two leads 20 are symmetrical with each other. Each lead 20 includes an inner section 22, an outer section 24 parallel to the inner section 22 and a connection section 26 interconnecting the inner section 22 and the outer section 24. The inner section 22 has a top face exposed within the cavity for electrically connecting with the light emitting die 30. The outer section 24 has a bottom face exposed on a bottom of the base 10 for electrically connecting with an external electrical structure (not shown) such as a conductive trace of a printed circuit board. The outer section 24 has a length larger than that of the inner section 22. The connection section 26 is perpendicular to the inner section 22 and the outer section 24. The leads 20 transfer power from the external electrical structures to the light emitting die 30 to drive the light emitting die 30 to lighten.

The light emitting die 30 is adhered on a face of the base 10 defining a bottom of the cavity. The light emitting die 30 is located between the two leads 20 and electrically connected to the inner sections 22 of the two leads 20 via two wires 32. The light emitting die 30 may be made of GaN, InGaN, AlInGaN, AlGaInP, GaInN or other suitable light emitting semiconductor materials, depending on the actual requirements of the light color. Preferably, GaN is selected to be the material for forming the light emitting die 30 of the embodiment for producing blue light. In order to further facilitate heat dissipation of the light emitting die 30, a portion of the base 10 below the light emitting die 30 and between the two leads 20 can be made of a kind of material having a thermal conductivity larger than that of the other part of the base 10.

The encapsulant 40 may be made of epoxy, silicone, polycarbonate, polymethylmethacrylate or other transparent materials. The encapsulant 40 is filled into the cavity and has a top face coplanar with that of the base 10. The encapsulant 40 has a first area 42 and a second area 44 surrounding the first area 42. The first area 42 of the encapsulant 40 is located at a center of the encapsulant 40 and seals the light emitting die 30 and the two wires 32 therein; the second area 44 of the encapsulant 40 encircles the first area 42 and is connected to the inner sections 22 of the leads 20. The first area 42 of the encapsulant 40 contains a first phosphor 60 doped therein, and the second area 44 of the encapsulant 40 contains a second phosphor 62 doped therein. The first phosphor 60 and the second phosphor 62 may be made of silicate compound, nitrides compound, YAG: Ce (cerium doped yttrium aluminum garnet), YAG: Tb (terbium doped yttrium aluminum garnet), or other suitable light-excitation materials. In this embodiment, the first phosphor 60 is different from the second phosphor 62 so that a color of light produced by the first phosphor 60 is different from that produced by the second phosphor 62. Preferably, the first phosphor 60 is made of $Y_3Al_5O_{12}$:Ce, and the second phosphor 62 is made of $CaAlSiN_3$:Eu. The first phosphor 60 can be excited by the blue light emitted from the light emitting die 30 to generate yellow light, and the second phosphor 62 can be excited by the blue light from the light emitting die 30 to generate red light. The yellow light from the first phosphor 60, the red light from the second phosphor 62 and the remaining blue light from the light emitting die 30 are mixed with each other to obtain white light having a color temperature about 4500K.

The electrochromic element 50 is fixed on the top face of the encapsulant 40. The electrochromic element 50 is annular and defines an opening 52 in a central area thereof. The electrochromic element 50 has a bottom face coincidental with a top face of the second area 44 of the encapsulant 40 so that the electrochromic element 50 substantially overlays the second area 44 of the encapsulant 40. The first area 42 of the encapsulant 40 is fully exposed within the opening 52 of the electrochromic element 50. The electrochromic element 50 can change its color or transmittance when it is applied with electricity. The electrochromic element 50 may be made of $WO_3$ which can change its color between achromic and deep blue, $MoO_3$ which can change its color between shallow yellow and black, $IrO_x$ which can change its color between achromic and blue-black, polyaniline which can change its color between shallow yellow and black, viologen which can change its color between achromic, blue and deep red, Prussian blue which can change its color between achromic, deep blue and shallow green, or NiO which can only change its transmittance. Preferably, the material of the electrochromic element 50 of the embodiment is $IrO_x$.

When the electrochromic element 50 is not applied with electricity, the electrochromic element 50 remains achromic and transparent to allow the light emergent from the second area 44 of the encapsulant 40 to transmit therethrough, which mixes with the light emergent from the first area 42 of the encapsulant 40 to obtain the white light having the color temperature about 4500K. When the electrochromic element 50 is applied with electricity, the electrochromic element 50 is turned to blue-black. The light emergent from the second area 44 of the encapsulant 40 is blocked by the electrochromic element 50 and cannot transmit to an outside environment through the electrochromic element 50, resulting in that only the light emergent from the first area 42 of the encapsulant radiates to the outside environment through the opening 52 of the electrochromic element 50. The light emergent from the first area 42 of the encapsulant 40 is white with a color temperature about 6100K. The optical characteristics of the light output from the LED unit in the two states are listed in the below table:

| State | Whether the electrochromic element is electrified | Luminous flux (lm) | Light emitting efficiency (lm/w) | Color temperature (K) | Color rendering (Ra) |
|---|---|---|---|---|---|
| 1 | No | 51 | 51 | 4500 | 81 |
| 2 | Yes | 45 | 45 | 6100 | 80 |

Figure 4:
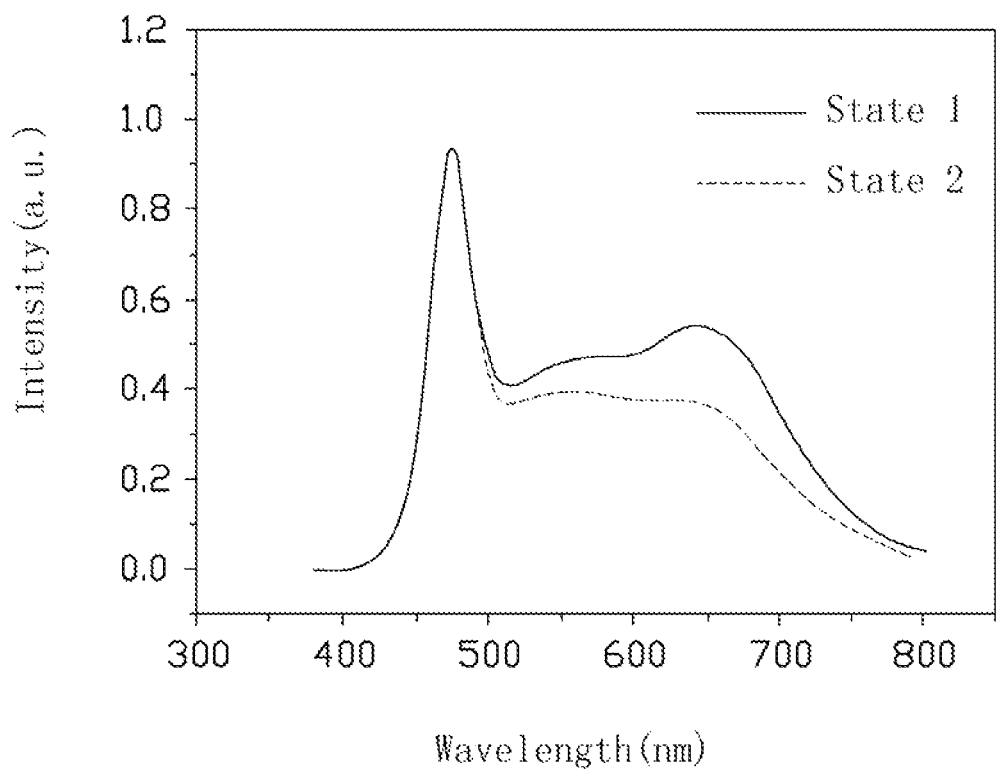
FIG. 4 shows two curves of optical characteristics of the light emitted from the LED unit of the present disclosure at the transparent state and the opaque state.

FIG. 4 also shows the difference between the output light from the LED unit at the state 1 and state 2. In the state 2, the red light ranging around 650 nm is reduced since the red light generated from the second phosphor 62 is blocked by black-blue electrochromic element 50. The intensity of the light in state 2 is also reduced since less light can transmit through the electrochromic element 50.

Using the electrochromic element 50, the LED unit has a simple structure compared with the conventional LED unit which has a driving device to rotate a disk. Accordingly, a total cost of the LED unit is reduced.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. An LED (light emitting diode) unit comprising:
an LED comprising:
a base;
a light emitting die mounted on the base;
a pair of leads fixed to the base and electrically connected to the light emitting die; and
an encapsulant attached to the base and covering the light emitting die; and
an electrochromic element mounted on the encapsulant of the LED to cover a part of the encapsulant, when the electrochromic element is applied with an electricity, at least one of a transmittance and a color of the electrochormic element being changed, thereby changing an optical characteristic of light output from the LED unit;
wherein the electrochromic element is annular and has an opening through a center thereof, the encapsulant having a first area exposed in the opening and a second area covered by the electrochromic element; and
wherein when the electrochromic element is applied with the electricity, light emitted from the first area of the encapsulant directly passes through the opening to an outside environment without being changed by the electrochromic element, and light emitted from the second area of the encapsulant passes through the electrochromic element and is changed by the electrochromic element.

2. The LED unit of claim 1, wherein the second area surrounds the first area, the light emitting die being sealed in the first area.

3. The LED unit of claim 2, wherein the first area of the encapsulant contains a first phosphor doped therein, and the second area of the encapsulant contains a second phosphor therein, the first phosphor being different from the second phosphor.

4. The LED unit of claim 3, wherein the first phosphor is excited by the light from the light emitting die to produce yellow light, and the second phosphor is excited by the light from the light emitting die to produce red light.

5. The LED unit of claim 1, wherein the electrochromic element is transparent and achromic when no electricity is input to the electrochromic element, and the electrochromic element turns black-blue when electricity is input to the electrochromic element.

6. The LED unit of claim 1, wherein the base defines a cavity in a top face thereof, the encapsulant being filled into the cavity.

7. The LED unit of claim 6, wherein each of the leads comprises an inner section exposed within the cavity, an outer section exposed on a bottom face of the base and a connection section interconnecting the inner section and the outer section.

8. The LED unit of claim 1, wherein a portion of the base located below the light emitting die and between the two leads has a thermal conductivity larger than that of other portions of the base.

9. An LED (light emitting diode) unit comprising:
a base;
a light emitting die mounted on the base;
a pair of leads fixed to the base and electrically connected to the light emitting die;
an encapsulant sealing the light emitting die, the encapsulant being transparent to allow light emitted from the light emitting die to transmit therethrough; and
an electrochromic element mounted on the encapsulant, the electrochromic element being switchable between a first state and a second state according to variation of electricity input thereto;
wherein the electrochromic element is annular and has an opening through a center thereof, the encapsulant having a first area exposed in the opening and a second area covered by the electrochromic element;

wherein when the electrochromic element is in the first state, light emitted from the first area of the encapsulant directly passes through the opening to an outside environment without being changed by the electrochromic element, and light emergent from the second area of the encapsulant transmits through the electrochromic element to the outside environment; and wherein when the electrochromic element is in the second state, the light emitted from the first area of the encapsulant still directly passes through the opening to the outside environment without being changed by the electrochromic element, and the light emergent from the second area of the encapsulant is at least partially blocked by the electrochromic element or has a color changed by the electrochromic element relative to that of the light emergent from the second area and transmitting to the outside environment through the electrochromic element in the first state.

10. The LED unit of claim 9, wherein the first area of the encapsulant has a first phosphor doped therein, and the second area has a second phosphor doped therein, the first phosphor being different from the second phosphor.

11. The LED unit of claim 9, wherein light from the first phosphor as being excited by the light from the light emitting die has a color temperature different from that of light from the second phosphor as being excited by the light from the light emitting die.

12. The LED unit of claim 9, wherein the electrochromic element is transparent in the first state and opaque in the second state.

* * * * *